United States Patent
Lee et al.

(10) Patent No.: US 6,933,212 B1
(45) Date of Patent: Aug. 23, 2005

(54) APPARATUS AND METHOD FOR DICING SEMICONDUCTOR WAFERS

(75) Inventors: Shaw Wei Lee, Cupertino, CA (US); Nghia T. Tu, San Jose, CA (US); Sadanand Patil, San Jose, CA (US); Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/757,303

(22) Filed: Jan. 13, 2004

(51) Int. Cl.[7] .......................................... H01L 21/301
(52) U.S. Cl. ...................... 438/464; 438/462; 438/460; 438/459
(58) Field of Search ............................... 438/464, 462, 438/458–460, 113

(56) References Cited

U.S. PATENT DOCUMENTS

| | | | |
|---|---|---|---|
| 6,075,280 A * | 6/2000 | Yung et al. | 257/620 |
| 6,121,118 A * | 9/2000 | Jin et al. | 438/460 |
| 6,162,703 A * | 12/2000 | Muntifering et al. | 438/465 |
| 6,184,109 B1 * | 2/2001 | Sasaki et al. | 438/464 |
| 6,583,032 B1 * | 6/2003 | Ishikawa et al. | 438/462 |

* cited by examiner

*Primary Examiner*—Luan Thai
(74) *Attorney, Agent, or Firm*—Beyer Weaver & Thomas LLP

(57) ABSTRACT

A method and apparatus for the dicing of semiconductor wafers using pressure to mechanically separate the individual die from the wafer without the use of a wafer saw. The method includes forming trenches along the scribe lines on a semiconductor wafer and then applying a mechanical pressure to the semiconductor wafer. The mechanical pressure causes a "clean break" of the wafer along the scribe lines, thereby singulating individual die on the wafer. The apparatus comprises a pad for supporting a semiconductor wafer and a positioning member to position the semiconductor wafer on the pad. A pressure mechanism is provided to apply a mechanical pressure to the wafer so as to singulate the individual die on the wafer.

19 Claims, 4 Drawing Sheets

*FIG. 2A*
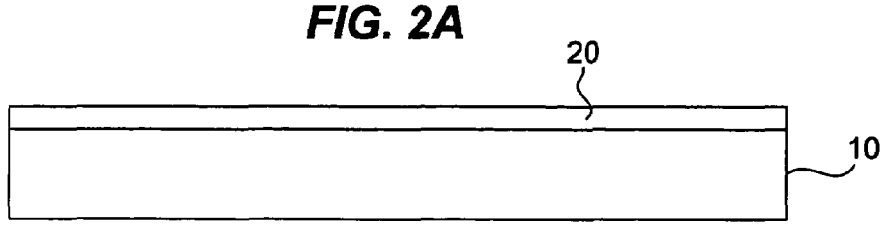
*FIG. 2B*
*FIG. 2C*
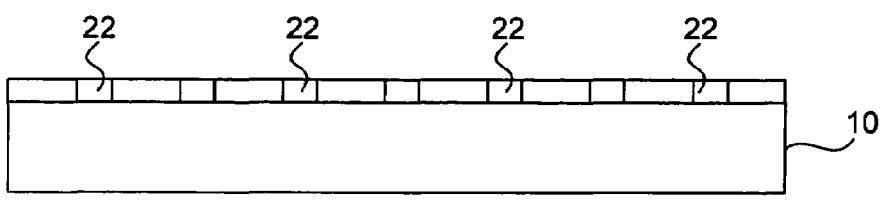
*FIG. 2D*
*FIG. 2E*
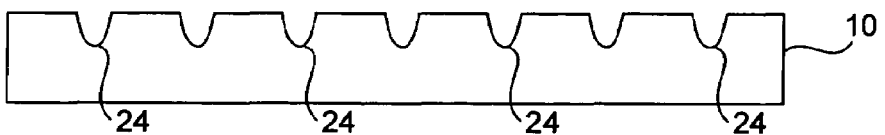
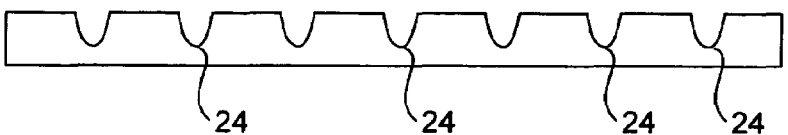
*FIG. 2F*
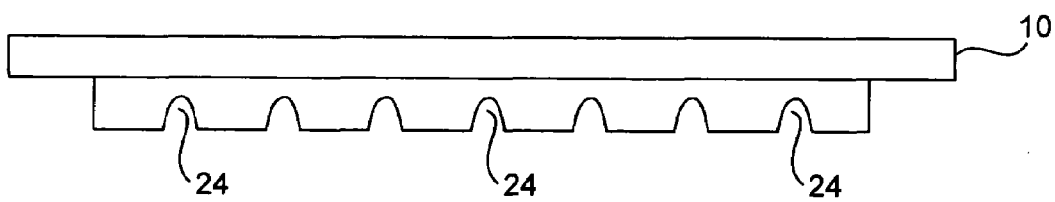
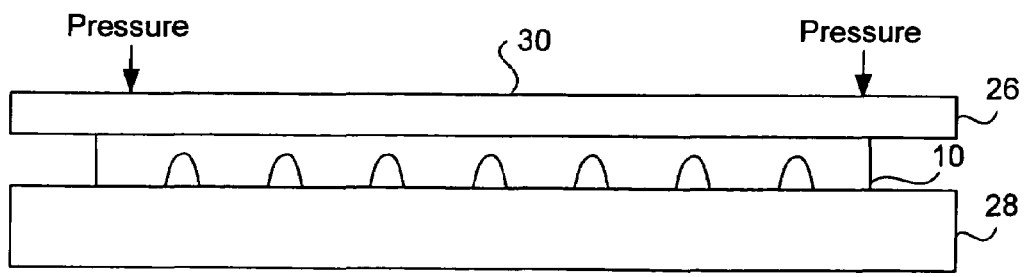
*FIG. 2G*

APPARATUS AND METHOD FOR DICING SEMICONDUCTOR WAFERS

FIELD OF THE INVENTION

The present invention relates generally to the dicing of semiconductor devices, and more particularly, to an apparatus and method for the dicing of semiconductor wafers using pressure to mechanically separate the individual die from the wafer.

BACKGROUND OF THE INVENTION

Semiconductor die are typically fabricated in wafer form. Using well known semiconductor fabrication techniques, a wafer undergoes a series of processing steps, such as deposition, masking, etching, implanting, doping, metallization, etc. to form complex integrated circuits on individual die on the wafer. Currently, several hundred to tens of thousands of die may be fabricated on a single wafer.

Use of a dicing machine is the common manner in which the individual die are singulated from the wafer. During dicing, the wafer is placed onto a cutting platform. A saw is then used to cut the wafer along the scribe lines, sometimes referred to as "saw streets", which run in the X and Y direction on the wafer and separate the individual dice. After all the saw streets have been cut, the individual die on the wafer are singulated.

There are a number of problems associated with the use of a wafer saw for dicing a semiconductor wafer. The process is relatively slow since each scribe line on the wafer is cut one at a time. On wafers with thousands of die and dozens or hundreds of scribe lines, the amount of time required to singulate all the die on the wafer may be significant. Maintenance of the wafer saw is also a problem. The machine periodically needs to be serviced and repaired. The cutting blade also needs to be replaced periodically. During the maintenance and repair, the machine cannot be used, reducing the overall throughput and efficiency of the wafer singulation operation. Another issue with using wafer saws is that as the thickness of wafers become thinner and thinner, the wafers tend to chip along the cutting edge. This chipping is problematic because it may damage or destroy otherwise functional die on the wafer, thereby reducing yields.

An apparatus and method for the dicing of semiconductor wafers using pressure to mechanically separate the individual die from the wafer without the use of a wafer saw is therefore needed.

SUMMARY OF INVENTION

To achieve the foregoing, and in accordance with the purpose of the present invention, a method and apparatus for the dicing of semiconductor wafers using pressure to mechanically separate the individual die from the wafer without the use of a wafer saw is disclosed. The method includes forming trenches along the scribe lines on a semiconductor wafer and then applying a mechanical pressure to the semiconductor wafer. The mechanical pressure causes a "clean break" of the wafer along the scribe lines, thereby singulating individual die on the wafer. The apparatus comprises a pad for supporting a semiconductor wafer and a positioning member to position the semiconductor wafer on the pad. A pressure mechanism is provided to apply a mechanical pressure to the wafer so as to singulate the individual die on the wafer.

BRIEF DESCRIPTION OF THE DRAWINGS

The invention, together with further advantages thereof, may best be understood by reference to the following description taken in conjunction with the accompanying drawings in which:

FIGS. 2A through 2G are a series of cross sections of a semiconductor wafer undergoing the wafer singulation process according to the present invention.

DETAILED DESCRIPTION OF THE INVENTION

Figure 1:
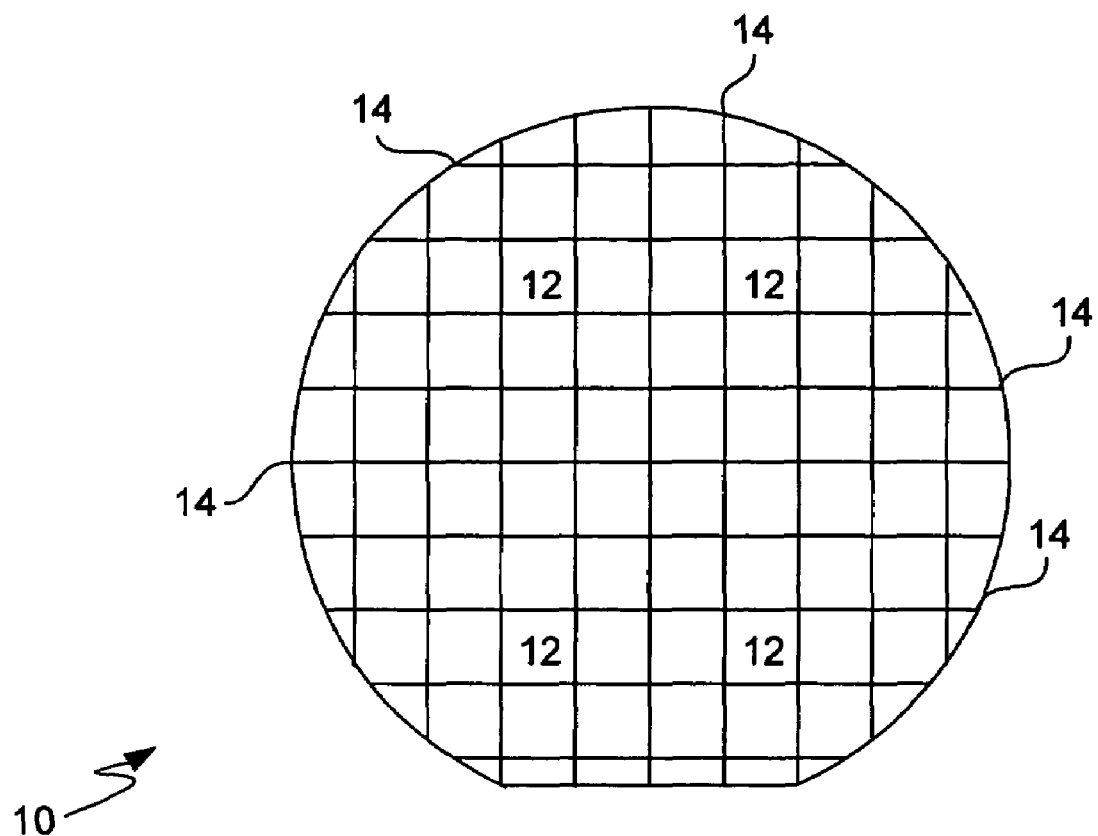
FIG. 1 is a diagram of semiconductor wafer.

Referring to FIG. 1, a diagram of semiconductor wafer is shown. The wafer 10 includes a plurality of die 12 fabricated thereon. Horizontal and vertical scribe lines 14 separate each of the die 12 on the wafer 10. After the individual die 12 wafer have been fabricated and probed, the individual die 12 are singulated as described below.

Referring to FIGS. 2A through 2G are a series of cross sections of a semiconductor wafer 10 undergoing the wafer singulation according to the present invention.

In FIG. 2A, the cross section of the wafer 10 is shown. Although not visible in this view, the individual die are fabricated on the top surface of the wafer 10.

In FIG. 2B, a photo resist layer 20 is applied across the top surface of the wafer 10. In one embodiment, the photo resist layer 20 is Silicon Nitride (S1N4) that is spun onto the surface of the wafer 10. The thickness of the photo resist layer 20 may range from 2 to 5 microns. The purpose of the photo resist layer 20 is to protect the underlying metallization and circuitry on the surface of the wafer 10.

In FIG. 2C, the photo resist layer 20 is patterned using standard photolithography techniques to form openings 22 over the scribe lines 14 on the surface of the wafer 10. The surface of the wafer 10 is thus exposed through the openings 22. Although not visible in FIG. 2C, it should be appreciated that the openings 22 run the entire length of the horizontal and vertical scribe lines 14 on the surface of the wafer 10.

In FIG. 2D, the patterned wafer undergoes an etch to form trenches 24 along the horizontal and vertical scribe lines 14 on the wafer surface. As is well known in the semiconductor fabrication art, the portions of the photo resist layer 20 left intact after patterning protects the underlying circuitry and metallization. The exposed portions of the wafer 10 as defined by the openings 22 in the photo resist layer, however, allow the underlying silicon of the wafer 10 to be etched away. In various embodiments of the invention, the depth of the trenches may vary from approximately ten percent to fifty percent of the thickness of the wafer 10. For example, for a wafer that is approximately 800 microns thick, the depth of the trenches 24 may range from 150 to 200 microns. It should be noted that this example should in no way be construed as limiting the invention. The depth of the trenches 24 may be greater or less than the 150 to 200 microns and may range as a total percentage of the overall thickness of the wafer from less than ten percent to more than fifty percent. The wafer 10 can also be etched using any of a number of well known techniques, for example a plasma etch or a wet etch. After the etch is performed, the photo resist layer 22 is removed using standard semiconductor processing techniques.

In an optional processing step as illustrated in FIG. 2E, the wafer 10 is back-grinded to reduce its overall thickness. In one embodiment for example, the 800 micron thick wafer 10 is back-grinded to a thickness of 300 to 200 microns. Again, this thickness range is only exemplary and should not be construed as limiting the invention in anyway. Generally speaking, the final thickness of the wafer 10 is largely dictated by the application of the die. With cell phones or any other application where small size and portability is desirable, generally the thinner the die the better. The thickness of the wafer 10 may be reduced further for example to 50 or less microns thick. In embodiments where the wafer 10 is going to be back-grinded, the depth of the trenches must be determined accordingly. For example, if a wafer is going to be back-grinded to a thickness of 200 microns, then the appropriate depth of the trenches 24 may be 50 to 100 microns. It should be noted that the back-grinding is optional and is not a required step in the practice of the present invention.

It should be understood that as semiconductor processing and handling technology improves in the future, it is generally expected that the thickness of wafers after back-grinding will become thinner and thinner. According to the spirit of the present invention, the type and duration of the etch used to form the trenches 24 during etching are dictated so that the final depth of the trenches 24 equals the desired percentage of the overall thickness of the wafer 10 after back-grinding.

Referring to FIG. 2F, a layer of adhesive tape 26 is applied to the back-surface of the wafer 10. In one embodiment, the tape 26 is standard wafer dicing tape such as "Nitto" tape commonly used in semiconductor process and handling, from the Nitto Denko Company of Japan.

Referring to FIG. 2G, the wafer 10 is placed active-surface down onto a soft pad 28. Mechanical pressure is then applied to the back surface 30 of the wafer 10. In various embodiments of the invention, the pressure may be applied in the X direction and the Y direction to cause the wafer to break along the horizontal and vertical scribes lines 14 respectively. In an alternative embodiment, pressure in a circular direction over the back surface 30 of the wafer 10 may also be applied. The applied pressure causes a "clean break" along the trenches 24, thus singulating the dice 12 on the wafer 10. The mechanism used to apply the pressure may include but is not limited to a roller, a blade, "squeegee" or a roller.

Figure 3A:
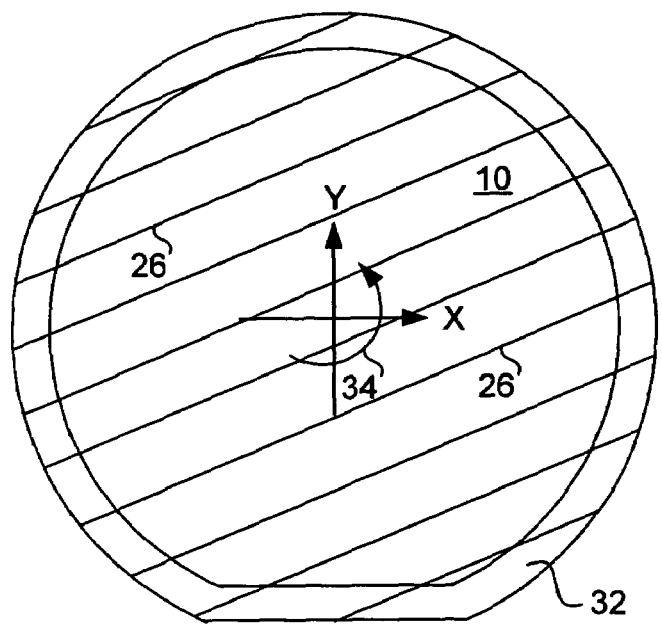
FIGS. 3A and 3B are a diagrams illustrating of a ring used to support the wafer during singulation according to the present invention.
Figure 3B:
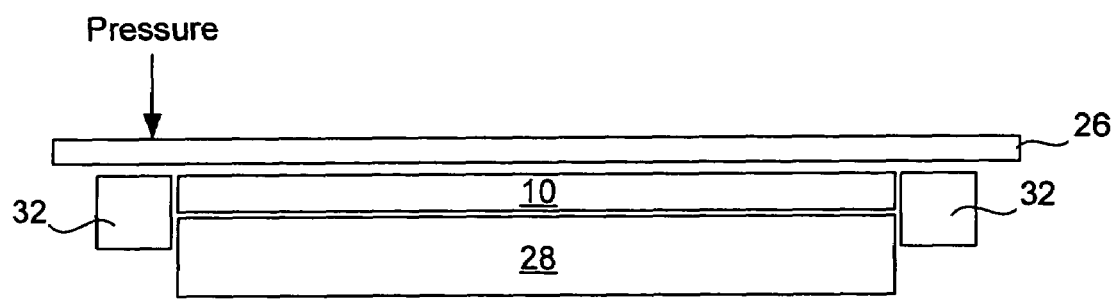

FIG. 3A is a top-down diagram illustrating a ring used to hold the wafer in place during singulation. The ring 32 has the same general shape and is placed around the circumference of the wafer 10. The wafer is placed, with its active surface facing down, onto pad 28 (not visible in FIG. 3A). The adhesive tape, denoted by lines 26, is visible on the back surface of the wafer through the ring 32. FIG. 3B is a cross section of the ring 32 and the wafer 10. As illustrated, the wafer 10 rests on pad 28. The ring 32 is provided around the circumference of the wafer 10. The tape 28 is provided on the back or non-active surface of the wafer 10. During singulation, pressure is applied to the back surface of the wafer 10. In various embodiments, the pressure is applied in the X and the Y directions across the back surface of the wafer 10 to cause the wafer to break along the horizontal and vertical scribe lines 14 respectively. In an alternative or additional embodiment, pressure may be applied in a circular motion around the wafer 10, as illustrated by the curved arrow 34 illustrated in FIG. 3A.

Figure 4:
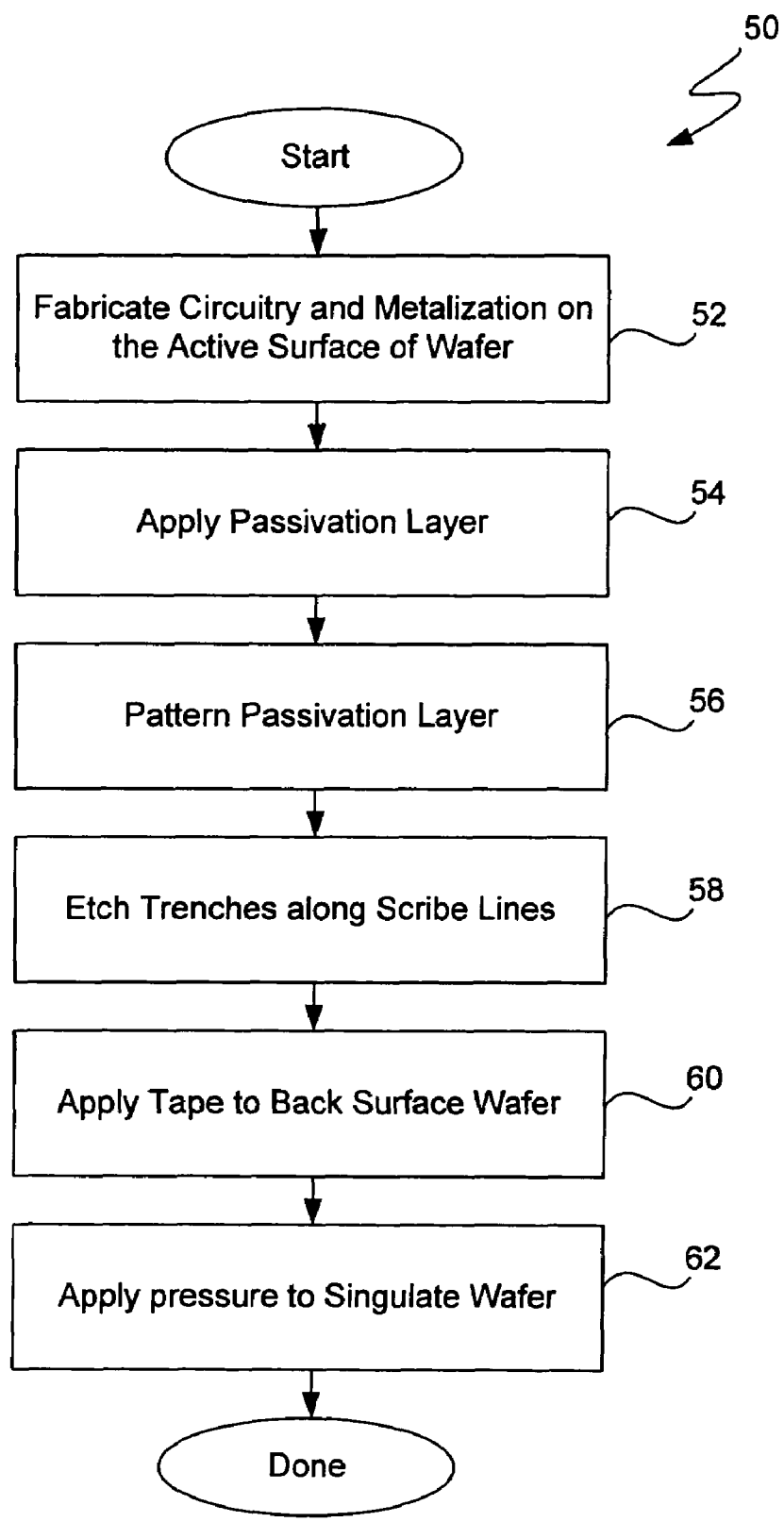
FIG. 4 is a flow diagram illustrating the method of the present invention. In the figures, like reference numbers refer to like components and elements.

FIG. 4 is a flow diagram 50 illustrating the sequence of the present invention. In the initial step, the circuitry and metallization are fabricated on the active surface of the wafer 10 (box 52). The photo resist layer 20 is then applied across the active surface of the wafer 10 (box 54) and then patterned (box 56) to form openings running the length of the horizontal and vertical scribe lines 14 on the wafer 10. Trenches 24 are then etched (box 58) in the openings along the horizontal and vertical scribe lines 14. An adhesive tape is then placed on the back-surface of the wafer (box 60). Pressure is next applied to the back surface causing the wafer 10 to break along the trenches 24 in the horizontal and vertical scribe lines, thereby singulating the dice 12 from the wafer 10.

Although the foregoing invention has been described in some detail for purposes of clarity of understanding, it will be apparent that certain changes and modifications may be practiced within the scope of the appended claims. For example, the present invention. may be used any sized wafer or any type of die, such as memory, logic, analog, microprocessor, MOS, bipolar, or any other type of semiconductor chip. Alternatively, the trenches may be formed by a partially cutting the wafer using a wafer saw to the desired depth instead of performing an etch. Similarly, the trenches could be formed on the bottom or non-active surface of the wafer. Therefore, the described embodiments should be taken as illustrative and not restrictive, and the invention should not be limited to the details given herein but should be defined by the following claims and their full scope of equivalents.

We claim:

1. A method, comprising;
    forming trenches along the scribe lines on a semiconductor wafer;
    applying a mechanical pressure to the semiconductor wafer; and
    singulating individual die on the wafer by applying the mechanical pressure on the surface of the wafer in a circular motion.

2. The method of claim 1, further comprising etching the wafer to form the trenches along the scribe lines.

3. The method of claim 2, wherein the etching is either a plasma etch or a wet etch.

4. The method of claim 1, further comprising partially cutting the wafer using a saw along the scribe lines to a desired depth to form the trenches.

5. The method of claim 1, wherein forming the trenches along the scribe lines further comprises:
    applying a photo resist layer over the active surface of the wafer;
    patterning the photo resist layer to form open regions running the length of the scribe lines on the wafer; and
    etching the wafer to form the trenches in the wafer as defined by the open regions.

6. The method of claim 1, further comprising applying tape onto the non-active surface of the wafer.

7. The method of claim 1, wherein the applying a mechanical pressure to the semiconductor wafer further comprises:
    (i) placing the active surface of the wafer onto a pad; and
    (ii) applying the mechanical pressure onto the back surface of the wafer.

8. The method of claim 7, wherein applying the mechanical pressure is done in a circular motion on the non-active surface of the wafer.

9. The method of claim 1, further comprising backgrinding the wafer to reduce its thickness prior to applying pressure to the wafer.

10. The method of claim 1, wherein the trenches have a depth approximately fifty percent or less of the thickness of the wafer.

11. The method of claim 1, wherein the trenches have a depth approximately fifty percent or more of the thickness of the wafer.

12. The method of claim 1, wherein the trenches have a depth of 300 microns or less.

13. The method of claim 1, wherein the trenches have a depth of 200 microns or less.

14. The method of claim 1, wherein the trenches have a depth of 1.00 microns or less.

15. An apparatus comprising:
a pad for supporting a semiconductor wafer;
a positioning member to position the semiconductor wafer on the pad; and
a pressure mechanism configured to apply a mechanical pressure onto the wafer in a circular motion so as to singulate the individual die on the wafer.

16. The apparatus of claim 15, wherein the pad is a resilient pad.

17. The apparatus of claim 15, wherein the positioning member is a ring configured to substantially fit around the circumference of the wafer.

18. The apparatus of claim 15, wherein the pressure mechanism comprises, but is not limited to, one of the following: a roller, a blade, or a squeegee.

19. The apparatus of claim 15 wherein the pressure mechanism is configured to apply pressure in a circular motion on a non-active surface of the wafer.

* * * * *